United States Patent [19]

Bowker et al.

[11] Patent Number: 4,861,345
[45] Date of Patent: Aug. 29, 1989

[54] METHOD OF BONDING A CONDUCTIVE LAYER ON AN ELECTRODE OF AN ELECTROCHEMICAL CELL

[75] Inventors: Jeffrey C. Bowker, Richland Township, Allegheny County; Prabhakar Singh, Pittsburgh, both of Pa.

[73] Assignee: Westinghouse Electric Corp., Pittsburgh, Pa.

[21] Appl. No.: 194,065

[22] Filed: May 13, 1988

[51] Int. Cl.$^4$ .............................................. H01M 8/02
[52] U.S. Cl. ................................. 29/623.1; 29/623.5; 429/31
[58] Field of Search ........................... 29/623.1, 623.5; 429/30, 31, 34, 193, 104; 228/219, 238, 903; 156/60, 89; 419/64, 30, 57

[56] References Cited

U.S. PATENT DOCUMENTS 4,547,437 10/1985 Isenberg et al. ...................... 429/30

Primary Examiner—Anthony Skapars
Attorney, Agent, or Firm—Daniel P. Cillo

[57] ABSTRACT

A dense, electronically conductive interconnection layer 26 is bonded onto a porous, tubular, electronically conductive air electrode structure 16, optionally supported by a ceramic support 22, by (A) providing an air electrode surface, (B) forming on a selected portion of the electrode surface 24, without the use of pressure, particles of $LaCrO_3$ doped with an element selected from the group consisting of Sr, Mg, Ca, Ba, Co, and mixtures thereof, where the particles have a deposit on their surface comprising calcium oxide and chromium oxide; (C) heating the particles with the oxide surface deposit in an oxidizing atmosphere at from 1,300° C. to 1,550° C., without the application of pressure, to provide a dense, sintered, interconnection material 26 bonded to the air electrode 16, where calcium and chromium from the surface deposit are incorporated into the structure of the $LaCrO_3$. A solid electrolyte layer 18 can be applied to the uncovered portion of the air electrode, and a fuel electrode 20 can be applied to the solid electrolyte, to provide an electrochemical cell 10.

10 Claims, 2 Drawing Sheets

METHOD OF BONDING A CONDUCTIVE LAYER ON AN ELECTRODE OF AN ELECTROCHEMICAL CELL

GOVERNMENT CONTRACT

The Government of the United States of America has rights in this invention pursuant to Contract No. DE-AC-0280-ET-17089, awarded by the U.S. Department of Energy.

BACKGROUND OF THE INVENTION

1. Field of the Invention

The present invention relates to a method of bonding a conductive interconnection layer on an electrode of a solid oxide electrolyte, electrochemical cell.

High temperature electrochemical cells are taught by Isenberg, in U.S. Pat. No. 4,490,444. In these type of cells, typified by fuel cells, a porous support tube of calcia stabilized zirconia, has an air electrode cathode deposited on it. The air electrode may be made of, for example, doped oxides of the perovskite family, such as $LaMnO_3$. Surrounding the major portion of the outer periphery of the air electrode is a layer of gas-tight solid electrolyte, usually yttria stabilized zirconia. A selected radial segment of the air electrode is covered by an interconnection material. The interconnection material may be made of a doped lanthanum chromite film. Suggested dopants are Mg, Ca, and Sr.

Both the electrolyte and interconnection material are applied on top of the air electrode by a modified chemical vapor deposition process, utilizing temperatures of from 1,200° C. to 1,400° C. in a reducing atmosphere, with the suggested use of vaporized halides of zirconium and yttrium for the electrolyte, and vaporized halides of lanthanum, chromium, magnesium, calcium or strontium for the interconnection material, as taught by Isenberg, in U.S. Pat. Nos. 4,597,170, and Isenberg et al., in 4,609,562.

It has been found, however, that there are certain thermodynamic and kinetic limitations in doping the interconnection from a vapor phase by a chemical vapor deposition process at 1,300° C. to 1,400° C. The vapor pressures of calcium chloride, and strontium chloride, are low at vapor deposition temperatures, and so, are not easily transported to the reaction zone at the surface of the air electrode. Thus, magnesium is the primary dopant used for the interconnection material. However, a magnesium doped lanthanum chromite interconnection, for example $La_{0.97}Mg_{0.03}CrO_3$, has a 12% to 14% thermal expansion mismatch with the air electrode and electrolyte materials. Additionally, use of halide vapors at 1,300° C. to 1,400° C., in a reducing atmosphere, at partial pressures of oxygen less than $10^{-4}$ atm., can interact with the air electrode material during the initial period of interconnection application. This causes, in some instances, air electrode leaching of main constituents, such as manganese, into the interconnection material, which can cause possible destabilization effects.

In an attempt to solve some of these problems, Isenberg et al., in U.S. Pat. No. 4,598,467, suggested applying a separate, vapor deposited interlayer of, for example, calcium and cobalt doped yttrium chromite, about 1 micron thick (0.001 millimeter), between the air electrode, and the interconnection material and electrolyte. Ruka, in U.S. Pat. No. 4,631,238, in an attempt to solve interconnection thermal expansion mismatch problems, taught cobalt doped lanthanum chromite, preferably also doped with magnesium, for example $LaCr_{0.93}Mg_{0.03}Co_{0.04}O_3$, as a vapor deposited interconnection material, using chloride vapors of lanthanum, chromium, magnesium, and cobalt. Component oxides, and other chemical forms which decompose to oxides upon heating, such as carbonates, oxalates, formates, and hydroxides, can also be mixed, pressed at approximately 352.5 kg./cm.$^2$ (34.475 MPa-Mega Pascals) and then sintered in an oven at approximately 1,450° C. to form bars of the material.

None of these solutions, however, solve all the potential problems of thermal expansion mismatch, Mn leaching from the air electrode, and the limitations of the incorporation of dopants such as calcium, strontium, and other materials such as cobalt and barium by vapor deposition, in a simple and economical fashion. Many of these problems appear to be associated with the chemical vapor deposition process itself.

Attempts to densify $La_{1-x}Sr_xCrO_3$, using solid state sintering, to form an electrode structure, are discussed by Groupp et al., J. Amer. Ceram. Soc., Vol. 59, No. 9–10, pp. 449–450 (1976). They noted that the material was difficult to fabricate by normal sintering techniques, primarily due to volatilization of Cr oxide compounds in oxidizing atmospheres. They prepared compositions containing up to 20 mole % Sr by dissolving nitrates of the constituent La, Sr, and Cr cations in a solution of citric acid and ethylene glycol, followed by evaporation at 135° C., to provide a glasslike resin, which was then calcined at 800° C., to provide a $La_{1-x}Sr_xCrO_3$ material. Powder samples of this material, with distilled water as binder, were uniaxially pressed, at 2,115 kg./cm.$^2$ (20.685 MPa), to provide discs of 55% to 60% theoretical density, which were then sintered in the temperature range of from 1,600° C. to 1,700° C. for 1 hour, at oxygen activities of from $10^{-12}$ to $10^{-11}$ atm., to provide compacts having maximum densities of 95%+.

Meadowcroft et al., Ceram. Bull., Vol. 58, No. 6, pp. 610–612, 615 (1979), also recognized oxidation and vaporization problems with Sr or Ca doped $LaCrO_3$ in air at over 1,600° C. They mixed $La_2O_3$ and $Cr_2O_3$ with $SrCO_3$, in appropriate amounts, and prefired the mixture in air at 1,400° C. The reacted powder was first uniaxially, and first isostatically pressed and fired at 1,500° C. in air. The influence of substitutions on vaporization rate was studied for: $La_{1-x}Sr_xCrO_3$ (0<x<0.2); $La_{0.8}Sr_{0.2}Al_{0.5}Cr_{0.5}O_3$; $La_{0.8}Sr_{0.2}Al_{0.25}Cr_{0.75}O_3$; $La_{0.8}Mg_{0.2}CrO_3$ and $La_{0.8}Ca_{0.2}Al_{0.25}Cr_{0.75}O_3$. The lowest vaporization rate was achieved for the calcium aluminum containing material.

Ruka, in U.S. Pat. No. 4,562,124, teaches a perovskite-like air electrode material which closely matches the thermal expansion characteristics of support tubes and solid oxide electrolytes in fuel cells. These materials are said to be single phase solid solutions. They are made by mixing the component powders, pressing over 70.5 kg./cm.$^2$ (68.95 MPa), and sintering at from 1,400° C. to 1,800° C. for 1 to 4 hours. Materials made include $La_{0.3}Ca_{0.5}Ce_{0.2}MnO_3$; $La_{0.7}Sr_{0.3}MnO_3$; $La_{0.7}Sr_{0.2}Ca_{0.1}MnO_3$; $La_{0.35}Ca_{0.65}MnO_3$; $La_{0.5}Ca_{0.5}CrO_3$ and $La_{0.3}Ca_{0.5}Ce_{0.2}CrO_3$. Air electrode application means are described as plasma spraying, and slurry dipping followed by sintering.

Other methods of making lanthanum and calcium chromium oxides have been tried. Alexandov et al., in U.S. Pat. No. 4,035,266 teach melt production of LaCrO$_3$; CaCr$_2$O$_4$; and Ca$_{0.5}$Sr$_{0.5}$Cr$_2$O$_4$, under the action of a high-frequency generator, with a working output of 60 kW at 300 kHz. The melt is then cooled, to provide an ingot of the refractory reaction mixture useful for fuel cell cathodes. None of these teachings provide low temperature formation of a lanthanum chromite structural element in an oxygen atmosphere, without pressure application, on high temperature-reduction degradable, fragile, lanthanum manganite air electrode material, in an electrochemical cell. It is an object of this invention to provide such a process.

DISCLOSURE OF THE INVENTION

Accordingly, the present invention resides in a method of bonding a dense, electronically conductive layer on a porous, electronically conductive electrode surface, characterized by the steps:

(A) providing an electrode surface, (B) forming, on a selected portion of the electrode surface, without the application of pressure, particles of LaCrO$_3$ doped with an element selected from the group consisting of Sr, Mg, Ca, Ba, Co, and mixtures thereof, where the particles have a deposit on their surface comprising calcium oxide and chromium oxide in an amount effective to lower the sintering temperature of the doped LaCrO$_3$ particles, (C) heating the particles containing the oxide deposit in an oxidizing atmosphere at a temperature of from approximately 1,300° C. to 1,550° C., without the application of pressure, to provide a dense, sintered interconnection material intimately bonded to the electrode, where calcium and chromium from the surface deposit are incorporated into the structure of the LaCrO$_3$.

The weight ratio of calcium oxide: chromium oxide is from approximately 0.4 to 9.0:1, and the weight ratio of calcium oxide+chromium oxide: doped LaCrO$_3$ particles, is from approximately 0.005 to 0.10:1. The doped LaCrO$_3$ particles will have a size of from approximately 0.1 micron to 15 microns diameter and will generally comprise a mixture of large and small particles. Prior to and during sintering, the calcium oxide+chromium oxide coating, usually a CaO+Cr$_2$O$_3$ coating, melts, draws the doped LaCrO$_3$ particles closer together, and aids low temperature sintering of the particles. This provides a 95%+ dense interconnection, with no vaporization of chromium from the particles, nor leaching of materials from the electrode.

The interconnection will also have a good thermal coefficient match with the electrode, due to calcium inclusion. The calcium oxide-chromium oxide can be applied to the doped LaCrO$_3$ particles, for example, by adding the particles to a solution of calcium nitrate and chromium nitrate, and heating in an oxidizing atmosphere to decompose nitrate and form a calcium oxide and chromium oxide deposit.

Preferably, the electrode structure on which the coated, doped LaCrO$_3$ particles are formed is a porous air cathode made of strontium doped lanthanum manganite, in the form of a tubular structure, optionally supported by a porous, stabilized zirconia support tube. Additional steps, including applying a solid electrolyte layer over the remaining portion of the air electrode, and applying a cermet fuel electrode anode over the electrolyte, will complete formation of an electrochemical cell. This method allows easy formation of the interconnection without use of vapor deposition or pressing steps, and lowers thermal expansion mismatch of the interconnection with the air electrode and electrolyte.

BRIEF DESCRIPTION OF THE DRAWINGS

In order that the invention can be more clearly understood, conventional embodiments thereof will now be described, by way of example, with reference to the accompanying drawings, in which.

DESCRIPTION OF THE PREFERRED EMBODIMENTS

Figure 1:
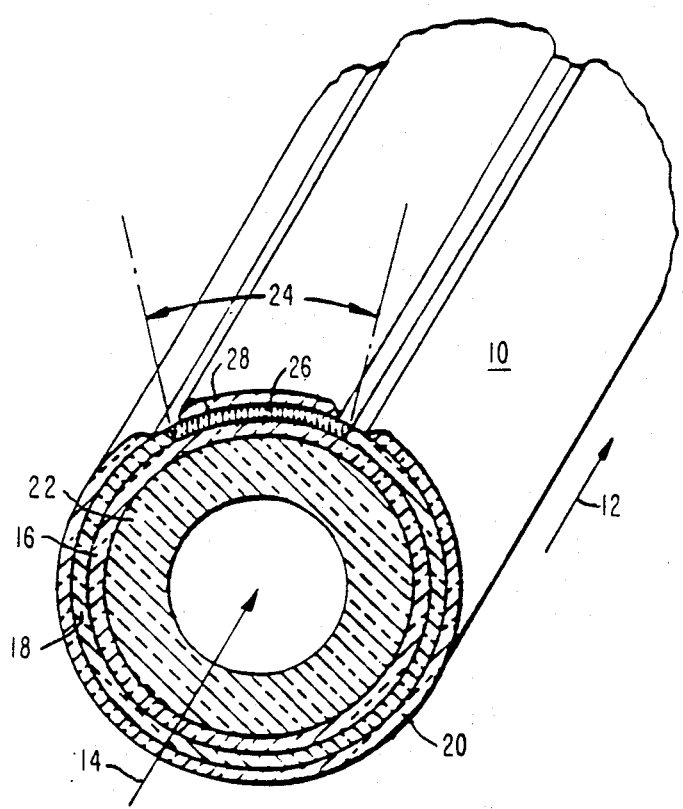
FIG. 1 is a schematic sectional view of a preferred embodiment of a single, tubular electrochemical cell, showing the interconnection layer on top of a supporting electrode.

Referring now to FIG. 1 of the Drawings, a preferred, tubular, electrochemical cell 10 is shown. The preferred configuration is based upon a fuel cell system, wherein a flowing gaseous fuel, such as a mixture of hydrogen and carbon monoxide, is directed axially over the outside of the cell, as indicated by the arrow 12, and an oxidant, such as air, or O$_2$ indicated by the arrow 14, flows through the inside of the cell. Where the cell is as shown, oxygen molecules pass through the porous, electronically conductive electrode structure 16 and are changed to oxygen ions which pass through the electrolyte 18, to combine with fuel at the fuel electrode 20.

It should be noted that the following description of the prepared tubular configuration should not be considered limiting. It should also be noted that the interconnection material of this invention, described hereinafter, could be applied to electrochemical cells other than fuel cells. The term "air electrode" as used throughout means that electrode which will be in contact with oxidant, and "fuel electrode" means that electrode that will be in contact with fuel.

The cell 10 can include an optional porous support tube 22. The support tube can be comprised of calcia stabilized zirconia, forming a porous wall approximately one to two millimeters thick. The air electrode, or cathode 16 is a porous, composite metal oxide structure approximately 50 microns to 1,500 microns (0.05 millimeter to 1.5 millimeter) thick. It can be deposited on the support tube by slurry dip and sinter techniques, or extruded as a self-supporting structure. The air cathode is, for example, comprised of doped oxides or mixtures of oxides of the perovskite family, such as LaMnO$_3$, CaMnO$_3$, LaNiO$_3$, LaCoO$_3$, LaCrO$_3$, and the like, preferably LaMnO$_3$. Preferred dopants are strontium, calcium, cobalt, nickel, iron, and tin, preferably strontium.

Surrounding most of the outer periphery of the air electrode 16 is a layer of gas-tight solid electrolyte 18, generally comprised of yttria stabilized zirconia about 1 micron to about 100 microns thick (0.001 millimeter to 0.1 millimeter). The electrolyte 18 is deposited onto the air electrode by well known, high temperature, vapor deposition techniques. In the case where electrolyte is to be deposited before the interconnection, a selected radial segment or portion 24 of the air electrode 16 is masked during electrolyte deposition and then a layer of a nonporous interconnection material 26 is deposited on this segment or portion 24. If the interconnection is to be deposited first then the electrolyte portion is masked initially.

The dense interconnection material 26, which preferably extends down the active axial length of each elongated cell 10 as shown, must be electrically conductive in both an oxidant and fuel environment. The gas-tight interconnection 26 is roughly similar in thickness to the electrolyte, about 30 microns to about 100 microns (0.03 millimeter to 0.1 millimeter). The interconnection should be non-porous (over about 95% dense) and preferably be nearly 99% to 100% electronically conductive at 1,000° C., the usual operating temperature of a fuel cell.

The interconnection must also have a coefficient of thermal expansion close to that of the solid electrolyte, and the electrode onto which it is deposited, and the other components, including the support tube, if used. The usual interconnection material is doped lanthanum chromite, of approximately 20 microns to 50 microns (0.02 millimeter to 0.05 millimeter) thickness. Usually, an electrically conductive layer 28 is deposited over the interconnection 26. This layer 28 is preferably comprised of the same material as the fuel anode 20, nickel or cobalt zirconia cermet, and about the same thickness, 100 microns.

Undoped lanthanum chromite is not very useful as an electronic interconnection, due to its combination of marginal conductivity, mismatch of thermal expansion coefficient with the rest of the fuel cell components, and phase transition from orthorhombic to rhombohedral near 275° C. In this invention, at least one of Sr, Mg, Ca, Ba and Co is present as a dopant throughout the interconnection material 26.

The interconnection in this invention will be made from sintered particles of calcium and chromium coated $La_{1-x}M_xCrO_3$, where M is a dopant element selected from the group consisting of Sr, Mg, Ca, Ba, Co, and mixtures thereof, and x=0.075 to 0.25. Ordinarily, sintering such particulate materials in uncoated form requires substantial pressures, and temperatures of over 1,700° C., with substantial loss of Cr and/or chromium oxides from the lattice structure. Such loss would lower electrical conductivity. By forming a combination calcium oxide+chromium oxide material, usually a $CaO+Cr_2O_3$ mixture, on the surface of the particles, it has been found that high density sintering can be accomplished at a much lower temperature, with no loss of chromium constituents from the particles, and with complete elimination of pressing. The term "without application of pressure", as used herein, means without application of traditional uniaxial or isostatic pressing techniques.

Calcium oxide plus chromium oxide appears to provide a unique combination for depositing on doped $LaCrO_3$ particles, because its melting point is below doped $LaCrO_3$, chromium is already present in the particle lattice, and calcium is very effective to match thermal expansion coefficients to the air electrode. The term "sintering" as used herein, means heating below the melting point of the main constituent particles, to provide a mass of bonded particles which may or may not contain unconnected porosity. The heating may cause some smaller particle incorporation onto the larger particles present.

In the method of this invention, doped $LaCrO_3$ particles, as described previously, having a particle size distribution of from 0.1 micron to 15 microns, preferably 0.5 micron to 10 microns diameter, are made or obtained. Within these ranges, preferably, at least 80% of the particles would be less than 10 microns, and at least 20% of the particles would be less than 1 micron. With the use of particles over 15 microns, densification without pressure will be difficult at 1,500° C. Under 0.1 micron, homogeneous mixing with Ca-Cr constituents will be difficult, and chromium oxide loss is possible upon heating.

These doped $LaCrO_3$ particles are then added to a salt solution containing both Ca and Cr, preferably calcium nitrate, i.e., $Ca(NO_3)_2.4H_2O$, plus chromium nitrate, i.e., $Cr(NO_3)_3.9H_2O$. Other useful salt solutions include calcium chloride plus chromium chloride, and like salts which upon heat reaction or decomposition are capable of forming a calcium oxide-chromium oxide material. In the case of the nitrates, heating alone will drive off water and gaseous oxides of nitrogen, leaving the oxides. In the case of chlorides, the metal chloride is reacted to gaseous oxides of chlorine, gaseous HCl, and metal oxide, where the metal oxide remains deposited. The use of chlorides is less preferred, due to possible contamination of fuel cell components.

The starting materials should be added so that the weight ratio of calcium oxide: chromium oxide formed after heating is from approximately 0.4 to 9.0:1, preferably from 0.75 to 4.5:1, and the weight ratio of calcium oxide and chromium oxide:doped $LaCrO_3$ particles is from approximately 0.005 to 0.10:1, preferably from 0.04 to 0.10:1. Less calcium oxide than 0.4:1 of chromium oxide, will not help match thermal coefficients of expansion between the interconnect and the air electrode. Either, more calcium oxide than 9.0:1 of chromium oxide or less than 0.4:1 of chromium oxide, will begin to upset the melt phase relationship between the two compounds so that there may not be complete melt coating of the doped $LaCrO_3$ particles. With less oxide mixture than 0.005:1 of doped $LaCrO_3$ particles, low temperature sintering will be hampered. With more oxide mixture than 0.10:1 of doped $LaCrO_3$ particles, much non conductive oxide will remain unincorporated into the $LaCrO_3$ structure.

Figure 2:
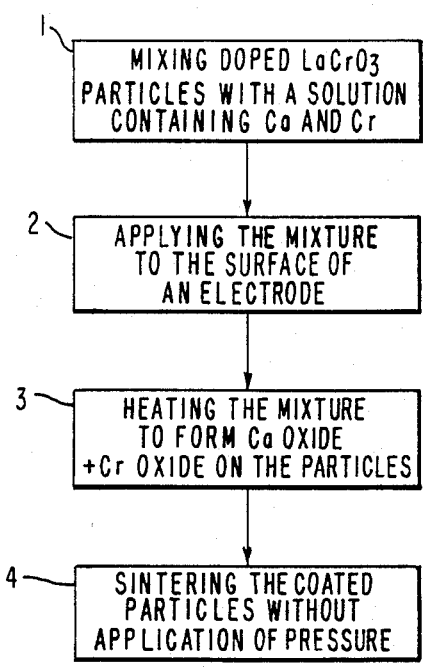
FIG. 2, which best describes the invention, is a block schematic drawing of the preferred method of this invention.

In the case of adding doped $LaCrO_3$ particles to an aqueous solution of calcium nitrate+chromium nitrate, a slurry will be formed, step 1 in FIG. 2 of the Drawings. This slurry, preferably, will be applied to a designated area of the electrode, step 2 in FIG. 2 of the Drawings, such as the axial, radial segment 24 shown in FIG. 1 of the Drawings. The slurry can be brushed on, applied by a tape casting method, or by any other technique not requiring pressing the thin and fragile air electrode material. At this point, the nitrate composition coats the doped $LaCrO_3$ particles.

The coated air electrode is then heated, first to drive off water, forming a deposit of fine calcium nitrate and chromium nitrate particles on the surface of the doped $LaCrO_3$. Continued heating will drive off gaseous oxides of nitrogen, and form fine calcium oxide chromium oxide particles on the surface of the doped $LaCrO_3$. Such elimination of nitrogen containing gases will usually occur at approximately 400° C. to 800° C., and may be accompanied by a temporary solid to liquid phase change. Such fine particles will be left on the surface of the doped $LaCrO_3$, to the extent that a discontinuous or continuous coating is present, step 3 in FIG. 2 of the Drawings.

Then, the doped LaCrO$_3$, with calcium oxide+chromium oxide on its particles surface, is further heated to approximately 1,050° C. to 1,250° C., within which range melting of the calcium oxide+chromium oxide begins, completely covering the doped LaCrO$_3$ particles, and flowing into voids or interstices between the particles. After this, the temperature is raised to 1,300° C. to 1,550° C., within which range additional melting may occur, and the doped LaCrO$_3$ material near the calcium oxide+chromium oxide melt dissolve therein, solidifying some of it. Smaller particles of doped LaCrO$_3$ material are incorporated into larger because of their higher surface energy, so that their grain boundary substantially disappears. Any remaining melt solidifies on cooling.

In this process, the calcium and chromium from the melt are incorporated into the doped LaCrO$_3$ particles, and gradually diffuse throughout the bulk of the doped LaCrO$_3$ particles. In this process, the doped LaCrO$_3$ particles sinter together at 1,300° C. to 1,550° C., which is much lower than their normal sintering temperature, step 4 in FIG. 2 of the Drawings. Thus, particle "grain growth" into the volume occupied by the calcium oxide+chromium oxide melt provides an almost complete densification without application of pressure. It is possible to form the interconnection on a green electrode, i.e., one not completely sintered, and then, sinter both the electrode and the calcium oxide plus chromium oxide coated, doped LaCrO$_3$ interconnection particles at the same time. In all instances where heating occurs in this invention, it takes place in an oxidizing atmosphere such as air or O$_2$.

Figure 3A:
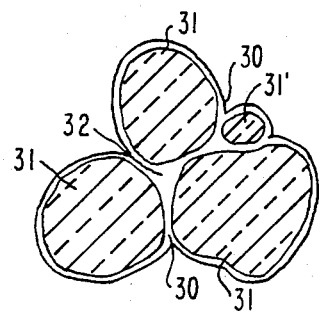
FIG. 3 shows an idealized microscopic view of the interconnection formation, with FIG. 3(A) showing melting of calcium oxide+chromium oxide, and FIG. 3(B) showing gain growth and sintering of doped LaCrO$_3$.
Figure 3B:
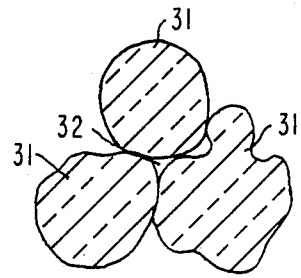

FIG. 3(A), illustrating the previous discussion, is an idealized microscopic view of the interconnect formation, and shows calcium oxide+chromium oxide melt 30, coating and disposed between the doped LaCrO$_3$ particles 31, and in voids 32 between particles. FIG. 3(B) shows doped LaCrO$_3$ partial dissolution and grain growth into the voids between particles at final sintering temperatures of 1,300° C. to 1,550° C., and reduction of the void volume to provide high density material. As can be seen in FIGS. 3(A) and 3(B), voids 32 are greatly reduced, and remain disconnected and one smaller particle has been incorporated into a larger particle.

In addition to in-situ formation of doped LaCrO$_3$ coated with calcium oxide+chromium oxide on the electrode, where the deposit of calcium oxide chromium oxide is formed by mixing the doped LaCrO$_3$ with a salt solution comprising calcium and chromium, followed by heating the mixture to form the oxides; the slurry of calcium+chromium salt solution plus doped LaCrO$_3$ particles can be applied to a glass plate, or the like, dried, and heated to drive off oxides of nitrogen or halide and provide calcium oxide+ chromium oxide on the doped LaCrO$_3$ particles. These particles can then be mixed with water or other fugitive liquid, and then applied to the electrode and sintered. Thus, the coated, doped LaCrO$_3$ particles can be "formed" on the electrode surface by a variety of means.

An additional forming method would involve plasma spraying the oxide coated, doped particles of LaCrO$_3$ as produced above, onto the electrode surface, followed by necessary heat treatment to bulk diffuse calcium and chromium. This plasma spraying would give a high initial density before final heating. The impact of particles in the process of plasma spraying is not considered an application of pressure. Plasma spraying would only be used for oxide coated LaCrO$_3$.

Additional application of a solid electrolyte layer over the remaining portion of the air cathode, if the electrolyte is to be applied after the interconnection, applying a cermet fuel electrode over the electrolyte, and then a cermet coating over the interconnection layer, will complete formation of an electrochemical cell, such as a fuel cell. Each fuel cell is preferably tubular and is electrically connected at least in series to an adjacent fuel cell. The electrical connection is made along the axial length of the interconnect through a metal fiber felt not shown in FIG. 1. A typical cell generates an open circuit voltage of approximately one volt, and multiple cells can be connected in parallel in order to provide a desired system voltage.

EXAMPLE 1

In order to determine if calcium nitrate+chromium nitrate would coat doped LaCrO$_3$ powder, be converted to oxide form, and allow sintering of the doped LaCrO$_3$ powder at temperatures below 1,600° C., the following experiment was performed. In 25 ml. of water, 0.9214 g. of Cr(NO$_3$)$_3$.9H$_2$O and 2.7371 g of Ca(NO$_3$)$_2$.4H$_2$O were dissolved in water. This would provide a wt. ratio of CaO:Cr$_2$O$_3$ of 3.714:1 upon heating to drive off H$_2$O and then oxides of nitrogen. Nineteen grams of La$_{0.83}$Sr$_{0.16}$CrO$_3$, having a particle size distribution of from approximately 0.1 micron to 10 microns was mixed into the solution to form a slurry.

The slurry was dried at 100° C. to drive off H$_2$O. The dried slurry was then pressed into a green pellet form. As a control, untreated La$_{0.83}$Sr$_{0.16}$CrO$_3$ particles were also formed into pellet form. Both types of pellets were heated at 1,400° C. for 85 minutes without the application of pressure during the heating. The treated powder passed through the oxide formation stage and then through the melting range of CaO+Cr$_2$O$_3$ during the heating. It was calculated that the wt. ratio of CaO+Cr$_2$O$_3$:La$_{0.83}$Sr$_{0.16}$CrO$_3$ was approximately 0.0434:1. The density and open porosity of each composition as determined by the Archimedes method is listed below in Table 1:

TABLE 1

| Sample | Density g/cm$^3$ | Open Porosity % |
|---|---|---|
| 1. Control-untreated | 4.39 | 32 |
| 2. Treated with Ca Nitrate + Cr Nitrate & heated to form oxides of Ca + Cr | 5.66 | 1 |

As can be seen, a very dense material resulted from the treated sample. Materials which were not found suitable as additives to the doped LaCrO$_3$ powder included CeTiO$_3$; CeO$_2$+TiO$_2$; LaF$_3$+MgF$_2$+CrO$_3$; and LaF$_3$+MgF$_2$. The cerium materials did not help densification, and the fluorine materials were very corrosive. Pressing in this Example was utilized only to provide a form for the material. In electrochemical cell application to an electrode, in one embodiment, the slurry itself would be coated directly onto an air electrode material and then heated and sintered without the application of pressure.

We claim:

1. A method of bonding a dense, electronically conductive layer on a porous, electronically conductive electrode structure comprising the steps:

(A) providing an electrode surface;

(B) forming, on a selected portion of the electrode surface, without the application of pressure, particles of $LaCrO_3$ doped with an element selected from the group consisting of Sr, Mg, Ca, Ba, Co, and mixtures thereof, where the particles have a deposit on their surface comprising calcium oxide and chromium oxide;

(C) heating the particles with the oxide surface deposit in an oxidizing atmosphere at from 1,300° C. to 1,550° C., without the application of pressure, to provide a dense, sintered, interconnection material bonded to the electrode, where calcium and chromium from the surface deposit are incorporated into the structure of the $LaCrO_3$.

2. The method of claim 1, where the weight ratio of calcium oxide:chromium oxide is from 0.4 to 9.0:1 and the weight ratio of calcium oxide and chromium oxide:-doped $LaCrO_3$ particles is from 0.005 to 0.10:1.

3. The method of claim 1, where the electrode is an air electrode, a solid electrolyte is applied to the uncovered portion of the air electrode, and a fuel electrode is applied to the solid electrolyte, to provide an electrochemical cell.

4. A method of bonding a dense, electronically conductive interconnection layer on a porous, tubular, electronically conductive air electrode structure comprising the steps:

(A) providing an air electrode surface;

(B) depositing, on a selected portion of the air electrode surface, without the application of pressure, a mixture of:

(1) particles of $LaCrO_3$ doped with an element selected from the group consisting of Sr, Mg, Ca, Ba, Co, and mixtures thereof, and (2) a salt solution comprising calcium and chromium, capable of forming oxides upon heating;

(C) heating the mixture up to 800° C. so that the particles have a deposit on their surface comprising calcium oxide and chromium oxide;

(D) continuing heating the particles with the oxide surface deposit, in an oxidizing atmosphere up to from 1,300° C. to 1,550° C., without the application of pressure, to provide a dense, sintered, interconnection material bonded to the air electrode, where calcium and chromium from the surface deposit are incorporated into the structure of the $LaCrO_3$.

5. The method of claim 4, where the weight ratio of calcium oxide:chromium oxide is from 0.4 to 9.0:1 and the weight ratio of calcium oxide and chromium oxide:-doped $LaCrO_3$ particles is from 0.005 to 0.10:1.

6. The method of claim 4, where the doped $LaCrO_3$ has the chemical formula $La_{1-x}M_xCrO_3$, where M is a dopant element selected from the group consisting of Sr, Mg, Ca, Ba, Co, and mixtures thereof, $x=0.075$ to 0.25, and the air electrode is comprised of doped oxides or mixtures of oxides of the perovskite family.

7. The method of claim 4, where, in step (D), during continued heating the calcium oxide and chromium oxide initially melt at approximately 1,050° C. to 1,250° C., completely cover the doped $LaCrO_3$ particles, and flow into voids between the particles, and as the temperature is raised to from 1,300° C. to 1,550° C., doped $LaCrO_3$ near the melt dissolves into the melt and then solidifies after step (D) substantially filling the voids.

8. The method of claim 4, where the calcium oxide and chromium oxide are a mixture of CaO plus $Cr_2O_3$.

9. The method of claim 4, where the salt solution deposited in step (B) is calcium nitrate plus chromium nitrate.

10. The method of claim 4, where a solid electrolyte is applied to the uncovered portion of the air electrode, and a fuel electrode is applied to the solid electrolyte, to provide an electrochemical cell.

* * * * *